(12) United States Patent
Chen et al.

(10) Patent No.: US 9,911,766 B2
(45) Date of Patent: Mar. 6, 2018

(54) ARRAY SUBSTRATE AND MANUFACTURING METHOD THEREOF, AND DISPLAY APPARATUS

(71) Applicants: BOE TECHNOLOGY GROUP CO., LTD., Beijing (CN); Chengdu BOE Optoelectronics Technology Co., Ltd., Chengdu, Sichuan Province (CN)

(72) Inventors: Yong Chen, Beijing (CN); Zailong Mo, Beijing (CN); Tianlei Shi, Beijing (CN); Seungyik Park, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 91 days.

(21) Appl. No.: 14/316,354

(22) Filed: Jun. 26, 2014

(65) Prior Publication Data

US 2015/0279859 A1    Oct. 1, 2015

(30) Foreign Application Priority Data

Mar. 26, 2014    (CN) .......................... 2014 1 0116558

(51) Int. Cl.
   *H01L 27/12*    (2006.01)
(52) U.S. Cl.
   CPC .......... *H01L 27/127* (2013.01); *H01L 27/124* (2013.01)
(58) Field of Classification Search
   CPC .. H01L 27/127; H01L 27/124; H01L 27/1248
   See application file for complete search history.

(56) References Cited

U.S. PATENT DOCUMENTS

| 2004/0207087 | A1* | 10/2004 | Kurashina | ......... | G02F 1/136227 257/758 |
| 2007/0247556 | A1* | 10/2007 | Jang | .................. | G02F 1/136209 349/38 |

(Continued)

FOREIGN PATENT DOCUMENTS

| CN | 1577014 A | 2/2005 |
| CN | 103383946 A | 11/2013 |

OTHER PUBLICATIONS

Matsumra et al., "Advanced excimer-laser annealing process for quasi single-crystal silicon thin-film devices", Elsevier Science S. A., Thin Solid Films 337, 1999, pp. 123-128.*

(Continued)

*Primary Examiner* — Steven Loke
*Assistant Examiner* — Juanita Rhodes
(74) *Attorney, Agent, or Firm* — Nath, Goldberg & Meyer; Joshua B. Goldberg; Stanley N. Protigal

(57) ABSTRACT

The present invention provides an array substrate and a manufacturing method thereof, and a display apparatus comprising the array substrate an array substrate, which can avoid poor displays due to large coupling capacitance between a data line and a pixel electrode in an array substrate in the prior art. The manufacturing method comprises the following steps: S1, forming a data line metal layer on a substrate, and forming a pattern of a data line by a patterning process; S2, forming a semiconductor layer on the substrate formed with the data line thereon, and forming a pattern of an active layer by a patterning process, wherein the data line is connected with the active layer.

13 Claims, 4 Drawing Sheets

(56) References Cited

U.S. PATENT DOCUMENTS

| | | | |
|---|---|---|---|
| 2008/0197356 A1* | 8/2008 | Kim | H01L 27/12 257/71 |
| 2009/0027579 A1* | 1/2009 | Aota | G02F 1/134363 349/41 |
| 2009/0242888 A1* | 10/2009 | Hosoya | G02F 1/136213 257/59 |
| 2010/0033645 A1 | 2/2010 | Nakagawa | |
| 2010/0208153 A1* | 8/2010 | Liu | G02F 1/136213 349/38 |
| 2014/0054581 A1* | 2/2014 | Song | G02F 1/1343 257/43 |
| 2014/0191238 A1* | 7/2014 | Hwang | H01L 27/1214 257/59 |
| 2015/0194443 A1* | 7/2015 | Chen | H01L 29/78645 257/72 |
| 2015/0303307 A1* | 10/2015 | Hara | H01L 29/7869 349/43 |

OTHER PUBLICATIONS

Spijkman et al., Dual-Gate Thin-Film Transistors, Integrated Circuits and Sensors, Jun. 14, 2011, Advanced Materials, 23,3231-3242.*
First Office Action and English translation of CN 201410116558.6.

* cited by examiner

ARRAY SUBSTRATE AND MANUFACTURING METHOD THEREOF, AND DISPLAY APPARATUS

FIELD OF THE INVENTION

The present invention relates to the field of display technology, and particularly, to an array substrate and manufacturing method thereof, and a display apparatus comprising the array substrate.

BACKGROUND OF THE INVENTION

In the field of display technology, a thin film transistor is usually used as a switching element for controlling operations of a pixel unit. According to characteristics of silicon thin films in active layer of thin film transistor, thin film transistors can be classified into two types of amorphous silicon (a-Si) thin film transistors and polycrystalline silicon (poly-Si) thin film transistors. Amorphous silicon thin film transistors have defects such as low on-state current, low electronic mobility, poor stability, etc., and polycrystalline silicon thin film transistors have superior performances such as high electronic mobility, low leakage current, and so on. Therefore, a display apparatus with polycrystalline silicon thin film transistors has high resolution and fast speed of response. Further, low temperature poly-silicon (LTPS) thin film transistors have ability to integrate with peripheral circuits, and are superior to traditional amorphous silicon thin film transistors in terms of carrier mobility, threshold voltage and threshold swing.

As shown in FIG. 1 to FIG. 3, a shield metal (SM) 1, a buffer layer 2, an active layer 3, a gate insulator (GI) 4, a gate line 5, an inter-layer dielectric (ILD) 6, a data line (S/D) 7, a pixel electrode (PITO) 9, a passivation layer (PVX) 10, and a common electrode (CITO) 11 are successively provided on a substrate 14 of an existing array substrate comprising a LTPS thin film transistor, and the array substrate further comprises a planarization layer (not shown in the figure) provided between the data line 7 and the common electrode 11, wherein the data line 7 is connected with the active layer 3 through a first via hole 12, and the pixel electrode 9 is connected with the active layer 3 through a second via hole 13. The second via hole 13 further comprises a via hole in the planarization layer, or further comprises a via hole in the passivation layer. There are two overlapped regions between projections of the gate line 5 and the active layer 3 on the substrate 14, thus two active regions (also referred to channel regions while being conducting) are formed in the active layer 3. During manufacturing the above array substrate, in order to form patterns of the shield metal, the first via hole passing through the buffer layer, the active layer, the gate line, the second via hole passing through the gate insulator and the inter-layer dielectric, the data line, the via hole in the planarization layer, the pixel electrode, the via hole in the passivation layer, and the common electrode, ten patterning processes are often required.

The inventor of the present invention finds that, there are at least following problems in the prior art: with respect to the existing array substrate comprising a LTPS thin film transistor, the manufacturing process thereof is complex, the cost of production is high, and the distance between the layer of the data line and the layer of the pixel electrode is small and the edge of the pixel electrode overlaps with the data line, thus a large coupling capacitance is produced between the pixel electrode and the data line, resulting in a transmission delay of the signal on the data line, which influences the distribution of the liquid crystal molecules around the pixel electrode, in turn, can lead to poor displays on the display apparatus comprising the array substrate, for example, vertical moirés in lumps are generated in the pictures displayed on the display apparatus.

SUMMARY OF THE INVENTION

With respect to poor displays due to the large coupling capacitance between the pixel electrode and the data line of the existing array substrate, the invention provides an array substrate and manufacturing method thereof, and a display apparatus comprising the array substrate, which can reduce the coupling capacitance between the data line and the pixel electrode of the array substrate, thereby the poor displays can be improved.

A technical solution to be employed to solve the technical problem to be solved by the present invention is a manufacturing method of an array substrate, comprising the following steps: S1, forming a data line metal layer on a substrate, and forming a pattern of a data line by a patterning process; S2, forming a semiconductor layer on the substrate formed with the data line thereon, and forming a pattern of an active layer by a patterning process, wherein the data line is connected with the active layer.

In the manufacturing method of an array substrate according to the present invention, the data line layer is first formed on the substrate, thus the distance between the data line layer and the pixel electrode becomes larger, and the coupling capacitance between the data line and the pixel electrode is reduced, thereby the poor displays due to the large coupling capacitance between the pixel electrode and the data line are avoided, and the quality of the displays are improved.

Further, the step S2 comprises: depositing a polycrystalline silicon layer on the substrate formed with the data line thereon by a molecular beam deposition method or a low pressure chemical vapor deposition method, or first depositing an amorphous silicon layer by a low pressure chemical vapor deposition method or a plasma enhanced chemical vapor deposition method, then forming a polycrystalline silicon layer by utilizing excimer laser annealing; forming a pattern of an active layer by patterning the polycrystalline silicon layer; forming an active region, a source region and a drain region by doping the active layer, wherein the source region and the drain region are located on two sides of the active region respectively, and the data line is connected with the source region.

Further, in the step S1, both of the pattern of the data line and a pattern of a shield metal for shielding the active region are formed by a single patterning process.

Before the step S2, the manufacturing method further comprises: forming a buffer layer on the substrate formed with the data line thereon, and forming a via hole, for connecting the data line and the source region to be formed in the active layer, in the buffer layer by a patterning process.

After the step S2, the manufacturing method further comprises: S3, forming a gate insulator and a conducting metal layer on the substrate formed with the active layer thereon, and forming a pattern of a gate line by a patterning process, wherein the overlapped region between the projections of the gate line and the active layer on the substrate corresponds to the active region.

After the step S3, the manufacturing method further comprises: S4, forming an inter-layer dielectric and a planarization layer on the substrate formed with the gate line thereon, and forming a via hole passing through the gate insulator, the inter-layer dielectric and the planarization layer by a patterning process, wherein the via hole will be used for connecting the drain region and a first transparent electrode to be formed; S5, forming a first transparent conducting layer on the substrate formed with the inter-layer dielectric and the planarization layer thereon, and forming a pattern of the first transparent electrode by a patterning process; S6, forming a passivation layer and a second transparent conducting layer on the substrate formed with the first transparent electrode thereon, and forming a pattern of a second transparent electrode by a patterning process.

Alternative, after the step S3, the manufacturing method further comprises: S4, forming an inter-layer dielectric, a planarization layer and a first transparent conducting layer on the substrate formed with the gate line thereon, and forming a pattern of a first transparent electrode by a patterning process; S5, forming a passivation layer on the substrate formed with the first transparent electrode thereon, and forming a via hole passing through the gate insulator, the inter-layer dielectric, the planarization layer and the passivation layer by a patterning process, wherein the via hole will be used for connecting the drain region and a second transparent electrode to be formed; S6, forming a second transparent conducting layer on the substrate formed with the passivation layer thereon, and forming a pattern of the second transparent electrode by a patterning process.

Further, the first transparent electrode is a plate-shaped electrode, and the second transparent electrode is a slit-shaped electrode.

A technical solution to be employed to solve the technical problem to be solved by the present invention is an array substrate comprising a data line and an active layer, wherein the data line is below the active layer, and the data line is connected with the active layer.

The array substrate further comprises a pattern of a shield metal for shielding the active region of the active layer, and the shield metal is below the active layer.

The array substrate further comprises a buffer layer between the data line and the active layer, and a via hole for connecting the data line and the active layer is formed in the buffer layer.

Further, the active layer is a low temperature poly-silicon layer, and the low temperature poly-silicon layer comprises an active region, a source region and a drain region, wherein the source region and the drain region are located on two sides of the active region respectively, and the data line is connected with the source region.

The array substrate further comprises a gate insulator and a gate line above the active layer, and the overlapped region of the projections of the gate line and the active layer on the substrate corresponds to the active region.

The array substrate further comprises an inter-layer dielectric, a planarization layer, a first transparent electrode, a passivation layer and a second transparent electrode, wherein the drain region is connected with the first transparent electrode through a via hole passing through the gate insulator, the inter-layer dielectric and the planarization layer.

The array substrate further comprises an inter-layer dielectric, a planarization layer, a first transparent electrode, a passivation layer and a second transparent electrode above the gate line, and the drain region is connected with the second transparent electrode through a via hole passing through the gate insulator, the inter-layer dielectric, the planarization layer and the passivation layer.

Further, the first transparent electrode is a plate-shaped electrode, and the second transparent electrode is a slit-shaped electrode.

In the array substrate of the present invention, the data line is below the active layer, resulting in an increased distance between the layer of the data line and the pixel electrode, thereby the coupling capacitance between the data line and the pixel electrode is reduced, and the poor displays due to the large coupling capacitance are improved.

A technical solution to be employed to solve the technical problem to be solved by the present invention is a display apparatus comprising the above array substrate.

As the display apparatus of the present invention comprises the above array substrate, the display quality thereof is improved.

DETAILED DESCRIPTION OF EMBODIMENTS

In order to make skilled persons in the art understand the technical solutions of the present invention better, the present invention will be described in detail below with reference to the drawings and specific embodiments. Obviously, the described embodiments are parts of embodiments of the present invention rather than all embodiments of the present invention. Based on the described embodiments of the present invention, all of other embodiments obtained by ordinary skilled persons in the art without any creative efforts will fall within the scope of the present invention.

Embodiment 1

Figure 1:
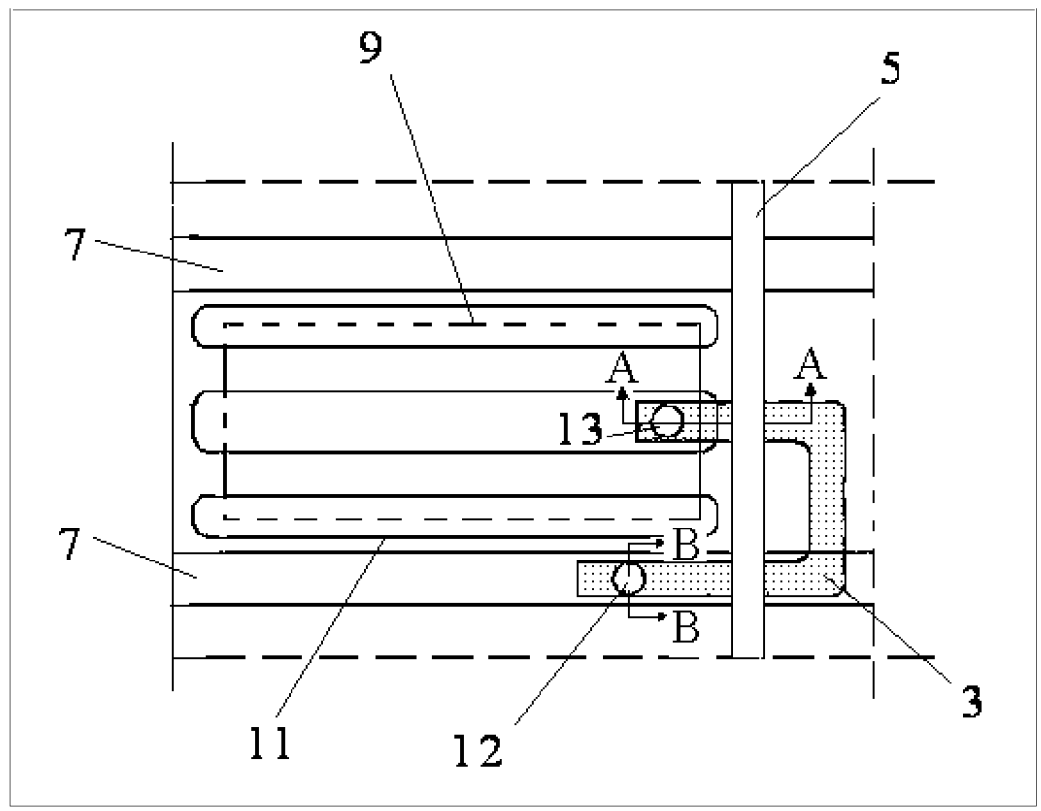
FIG. 1 is a schematic diagram of a structure of an array substrate in prior art.
Figure 2:
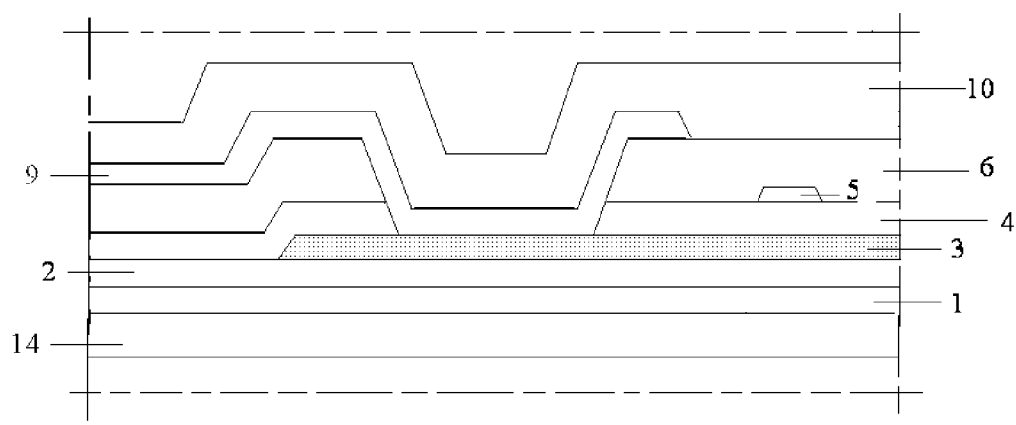
FIG. 2 is a sectional diagram of the array substrate of FIG. 1 along the line A-A.
Figure 3:
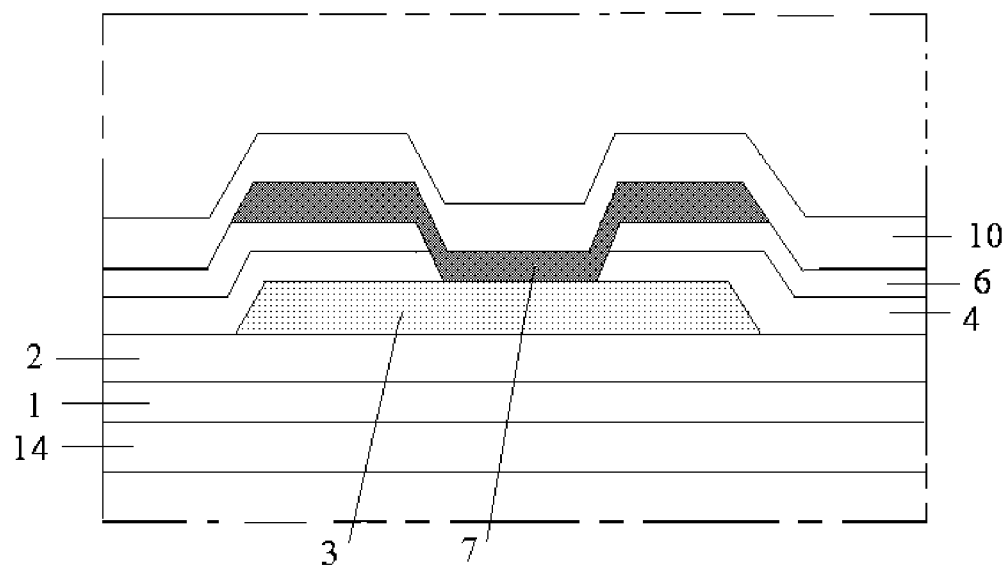
FIG. 3 is a sectional diagram of the array substrate of FIG. 1 along the line B-B.
Figure 4:
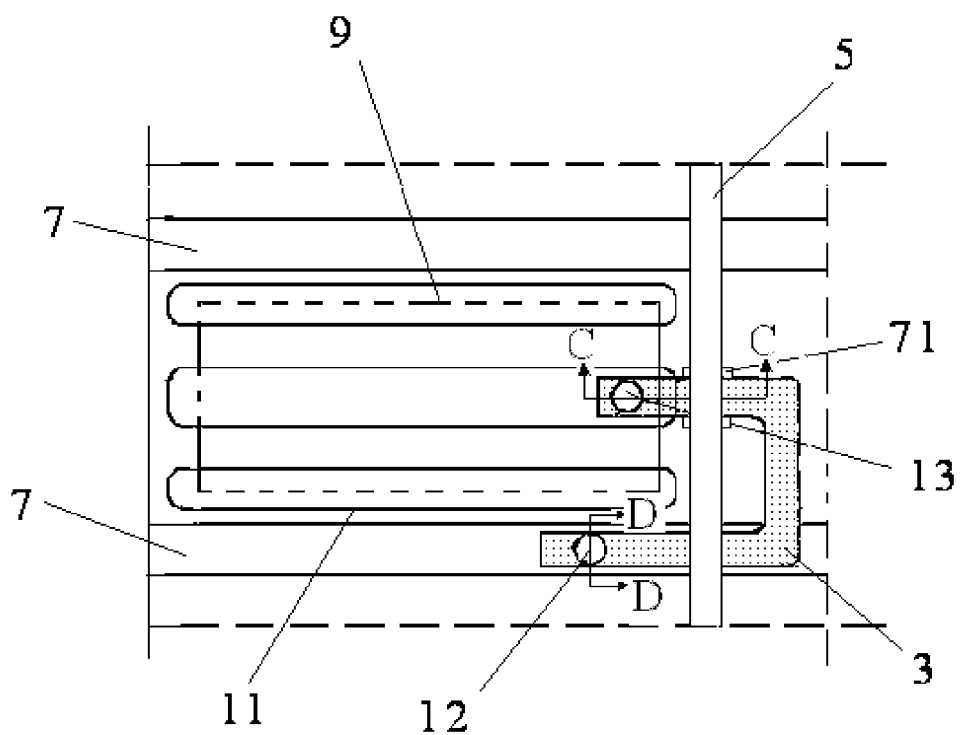
FIG. 4 is a schematic diagram of a structure of an array substrate in embodiment 1 of the present invention.
Figure 5:
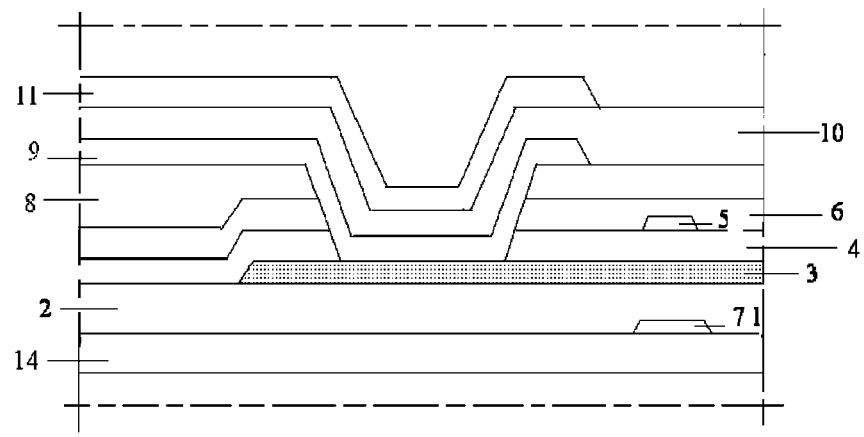
FIG. 5 is a sectional diagram of the array substrate of FIG. 4 along the line C-C.
Figure 6:
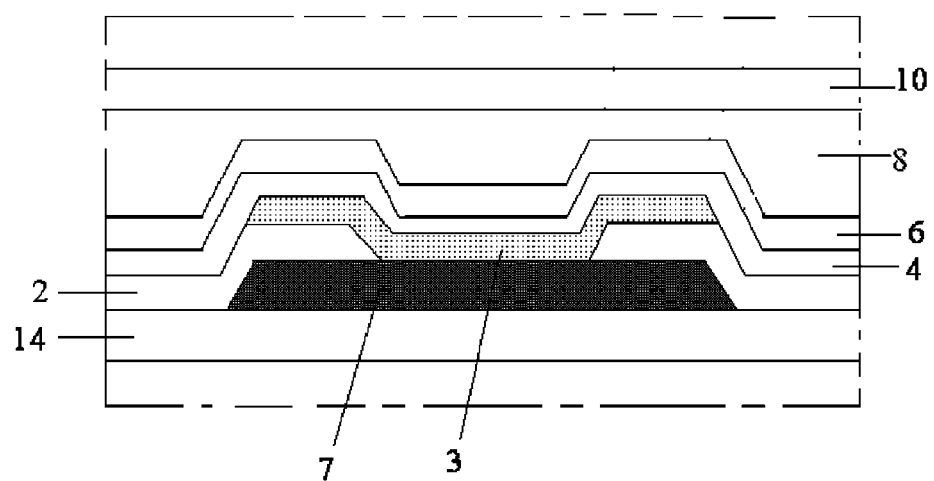
FIG. 6 is a sectional diagram of the array substrate of FIG. 4 along the line D-D.

The present embodiment provides a manufacturing method of an array substrate. Referring to FIGS. 4-6, the manufacturing method comprises the following steps.

S1, depositing a data line metal layer on a substrate 14 by sputtering, thermal evaporation method, or other film forming methods, and forming a pattern of a data line 7 by a patterning process. The substrate 14 may be a glass substrate or other types of transparent substrate, and the data line metal layer may be formed of one of chromium (Cr), molybdenum (Mo), aluminum (Al), copper (Cu), tungsten (W), neodymium (Nd), or formed of an alloy of them. Moreover, the data line metal layer may be of one layer or more than one layers.

S2, forming a semiconductor layer on the substrate 14 formed with the data line 7 thereon, and forming a pattern of an active layer 3 by a patterning process, wherein the data line 7 is connected with the active layer 3.

The step S2 further comprises: depositing a polycrystalline silicon layer on the substrate 14 formed with the data line 7 thereon by a molecular beam deposition (MBD) method or a low pressure chemical vapor deposition (LPCVD) method, or first depositing an amorphous silicon layer by a low pressure chemical vapor deposition (LPCVD) method or a plasma enhanced chemical vapor deposition (PECVD) method, then forming a polycrystalline silicon layer by utilizing excimer laser annealing (ELA); forming a pattern of an active layer 3 by patterning the polycrystalline silicon layer; forming an active region, a source region and a drain region by doping the active layer 3, wherein the source region and the drain region are located on two sides of the active region respectively, and the data line 7 is connected with the source region.

The active layer 3 of the array substrate is formed of polycrystalline silicon, thus the display apparatus comprising the array substrate has high resolution and fast speed of response.

Further, in the step S1, both of the pattern of the data line 7 and a pattern 71 of a shield metal for shielding the active region are formed by a patterning process. That is, both of the pattern of the data line 7 and the pattern 71 of the shield metal for shielding the active region are formed by the data line metal layer through a single patterning process, which simplifies the process steps and improves the production efficiency.

Moreover, as the active layer 3 is a semiconductor layer formed of polycrystalline silicon, as the semiconductor material is photosensitive, when it is irradiated by light (such as light from a backlight module), a leakage current may be generated therein, which influences performances of the active layer 3, and there may be adverse impacts on the performances of the thin film transistor. With the pattern 71 of the shield metal shielding the active region of the thin film transistor, the leakage current generated by irradiating light on the active layer 3 is reduced effectively, thereby the performances of the thin film transistor are improved, and the performances of the array substrate are improved.

It should be noted that, as the regions of the active layer 3 except for the active region are the source region and the drain region, and the source region and the drain region are formed by doping and thus have a high doping concentration, thus the source region and the drain region are not needed to be shielded.

Before the step S2, the manufacturing method further comprises a step of forming a buffer layer 2, that is, forming a buffer layer 2 on the substrate 14 formed with the data line 7 thereon by a plasma enhanced chemical vapor deposition method and the like, and forming a first via hole 12 in the buffer 2 by a patterning process, wherein the first via hole 12 will be used for connecting the data line 7 and an active region to be formed in the active layer 3. The material of the buffer layer 2 may be silicon dioxide (such as SiOx) or silicon nitride (such as SiNx) and the like, or may be combination of silicon dioxide and silicon nitride.

When an excimer laser annealing process is utilized for forming the polycrystalline silicon layer, a lot of heat may be generated by the utilized laser, and the buffer layer 2 is provided for absorbing the heat, thereby avoiding adverse impacts on the substrate 14, and maintaining good performances of the substrate 14.

After the step S2, the manufacturing method further comprises: S3, forming a gate insulator 4 and a conducting metal layer (gate metal layer) on the substrate 14 formed with the active layer 3 thereon, and forming a pattern of a gate line 5 by a patterning process (wherein, there is a overlapped region between the projections of the gate line 5 and the active layer 3 on the substrate 14, and the part of the gate line 5 corresponding to the overlapped region functions as a gate electrode), wherein the overlapped region between the projections of the gate line 5 and the active layer 3 on the substrate 14 corresponds to the active region.

The gate insulator 4 may be formed by a plasma enhanced chemical vapor deposition method and the like, and the material of the gate insulator 4 may be silicon dioxide (such as SiOx) or silicon nitride (such as SiNx) and the like, or may be combination of silicon dioxide and silicon nitride.

The conducting metal layer (gate metal layer) may be deposited by sputtering, thermal evaporation method, or other film forming methods, and the conducting metal layer may be formed of one of chromium (Cr), molybdenum (Mo), aluminum (Al), copper (Cu), tungsten (W), neodymium (Nd), or an alloy of them, and the gate metal layer may be of one layer or more than one layers.

In the present embodiment, the manufacturing method further comprises the steps of forming a pixel electrode and a common electrode. Specially, after the step S3, the manufacturing method further comprises: S4, forming an inter-layer dielectric 6 and a planarization layer 8 on the substrate 14 formed with the gate line 5 thereon, and forming a second via hole 13 passing through the gate insulator 4, the inter-layer dielectric 6 and the planarization layer 8 by a patterning process, wherein the second via hole 13 will be used for connecting the drain region and a first transparent electrode to be formed; S5, forming a first transparent conducting layer on the substrate 14 formed with the inter-layer dielectric 6 and the planarization layer 8 thereon, and forming a pattern of the first transparent electrode by a patterning process; S6, forming a passivation layer 10 and a second transparent conducting layer on the substrate 14 formed with the first transparent electrode thereon, and forming a pattern of a second transparent electrode by a patterning process.

Further, the first transparent electrode is a plate-shaped pixel electrode 9, and the second transparent electrode is a slit-shaped common electrode 11.

That is, in these steps of forming the pixel electrode and the common electrode, the pixel electrode is formed first, and the common electrode is then formed.

Figure 7:
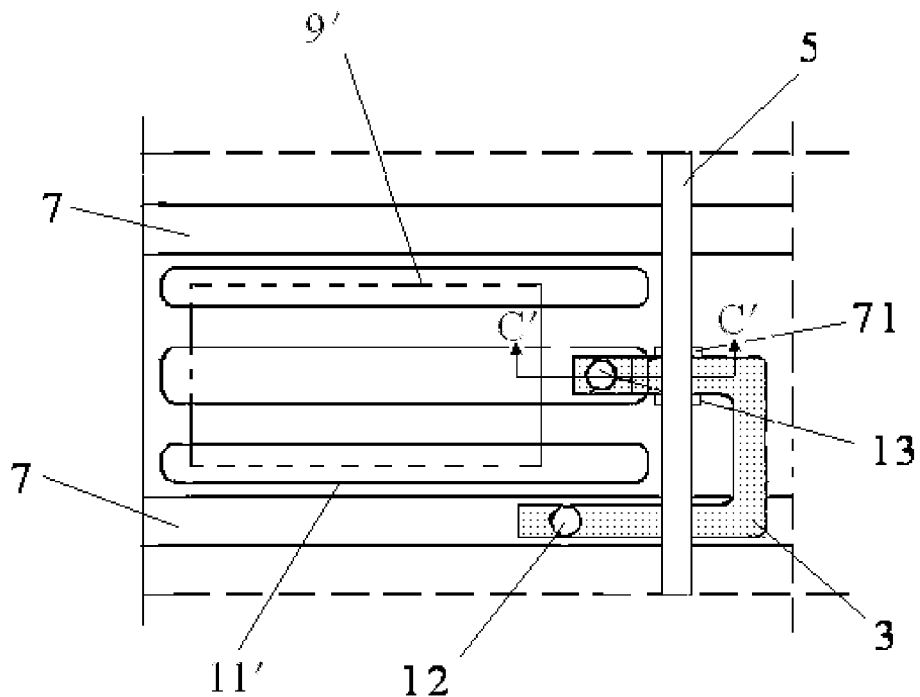
FIG. 7 is a schematic diagram of another structure of an array substrate in embodiment 1 of the present invention.
Figure 8:
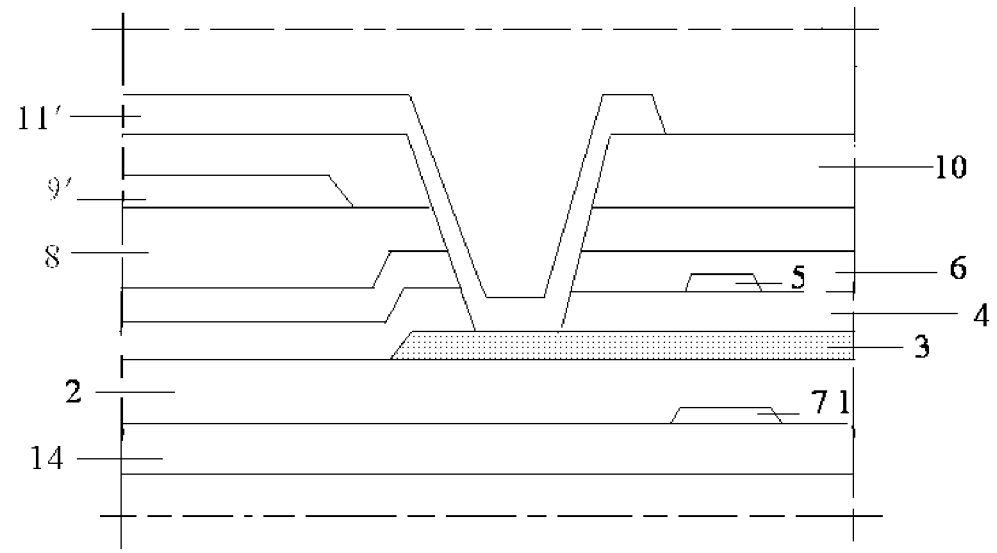
FIG. 8 is a sectional diagram of the array substrate of FIG. 7 along the line C'-C'.

Of course, the common electrode may be formed first and the pixel electrode is then formed. Specifically, as shown in FIG. 7 and FIG. 8, after the step S3, the manufacturing method further comprises: S4, forming an inter-layer dielectric 6, a planarization layer 8 and a first transparent conducting layer on the substrate 14 formed with the gate line 5 thereon, and forming a pattern of a first transparent electrode by a patterning process; S5, forming a passivation layer 10 on the substrate 14 formed with the first transparent electrode thereon, and forming a second via hole 13 passing through the gate insulator 4, the inter-layer dielectric 6, the planarization layer 8 and the passivation layer 10 by a patterning process, wherein the second via hole 13 will be used for connecting the drain region and a second transparent electrode to be formed; S6, forming a second transparent conducting layer on the substrate 14 formed with the passivation layer 10 thereon, and forming a pattern of the second transparent electrode by a patterning process.

Further, the first transparent electrode is a plate-shaped common electrode 9', and the second transparent electrode is a slit-shaped pixel electrode 11'.

The inter-layer dielectric 6 may be formed by a plasma enhanced chemical vapor deposition method and the like, and the material of the inter-layer dielectric 6 may be silicon dioxide (such as SiOx) or silicon nitride (such as SiNx) and the like, or may be combination of silicon dioxide and silicon nitride. The material of the planarization layer 8 may be acrylic material and the like.

The first transparent electrode layer and the second transparent electrode layer may be formed by magnetron sputtering, thermal evaporation method, or other film forming methods, and may be formed of indium tin oxide (ITO), indium zinc oxide (IZO), or zinc aluminium oxide and the like.

The passivation layer 10 may be formed by a plasma enhanced chemical vapor deposition method and the like, and the material of the passivation layer 10 may be silicon oxide (such as SiOx) or silicon nitride (such as SiNx) and the like, or may be combination of silicon oxide and silicon nitride.

It should be noted that, in the present embodiment, the patterning process may only comprise photolithographic process, or comprises photolithographic process and etching process, and may further comprise printing, ink-jetting and other processes for forming a predefined pattern. The photolithographic process is a process for forming a pattern by using photoresist, mask plate, exposing machine and so on, which comprises film forming process, exposing process, developing process and so on. Corresponding patterning process may be selected according to the structure to be formed in the present invention.

In the manufacturing method of the present embodiment, the data line 7 is first formed on the substrate 14, compared with the case that the data line 7 is provided above the active layer 3, the distance between the data line 7 and the pixel electrode becomes larger, and the coupling capacitance between the data line 7 and the pixel electrode is reduced, thereby the poor displays due to the large coupling capacitance between the data line and the pixel electrode are improved, and the display quality is improved.

Embodiment 2

The present embodiment provides an array substrate. As shown in FIG. 4 to FIG. 8, the array substrate comprises a data line 7 and an active layer 3, wherein the data line 7 is below the active layer 3, and the data line 7 is connected with the active layer 3. Of course, the array substrate further comprises some known structures such as a gate line 5, a pixel electrode and so on, which are not described here.

The array substrate further comprises a pattern 71 of a shield metal for shielding the active region of the active layer 3, and the pattern 71 of the shield metal is below the active layer 3. As the active layer 3 is a semiconductor layer formed of polycrystalline silicon, and the semiconductor material is photosensitive, when it is irradiated by light (such as light from a backlight module), a leakage current may be generated therein, which influences performances of the active layer 3, and there may be adverse impacts on the performances of the thin film transistor. With the pattern 71 of the shield metal shielding the active region of the thin film transistor, the leakage current generated by irradiating light on the active layer 3 is reduced effectively, thereby the performances of the thin film transistor are improved, and the performances of the array substrate are improved.

The array substrate further comprises a buffer layer 2 between the data line 7 and the active layer 3, and a via hole for connecting the data line 7 and the active layer 3 is formed in the buffer layer 2.

In the present invention, the active layer 3 is a polycrystalline silicon layer, When an excimer laser annealing process is utilized for forming the polycrystalline silicon layer, a lot of heat may be generated by the utilized laser, and the buffer layer 2 is provided for absorbing the heat, thereby avoiding adverse impacts on the substrate 14, and maintaining good performances of the substrate 14.

Further, the active layer 3 is preferably a low temperature poly-silicon layer, and the low temperature poly-silicon layer comprises an active region, a source region and a drain region, wherein the source region and the drain region are located on two sides of the active region respectively, and the data line 7 is connected with the source region.

The array substrate further comprises a gate insulator 4 and a gate line 5 above the active layer 3, and the overlapped region of the projections of the gate line 5 and the active layer 3 on the substrate corresponds to the active region.

As shown in FIG. 4 to FIG. 6, the array substrate further comprises an inter-layer dielectric 6, a planarization layer 8, a first transparent electrode, a passivation layer 10 and a second transparent electrode above the gate line 5, and the drain region is connected with the first transparent electrode through a via hole passing through the inter-layer dielectric 6 and the planarization layer 8.

Further, the first transparent electrode is a plate-shaped pixel electrode 9, and the second transparent electrode is a slit-shaped common electrode 11.

As shown in FIG. 7 and FIG. 8, the array substrate further comprises an inter-layer dielectric 6, a planarization layer 8, a first transparent electrode, a passivation layer 10 and a second transparent electrode above the gate line 5, and the drain region is connected with the second transparent electrode through a via hole passing through the inter-layer dielectric 6, the planarization layer 8 and the passivation layer 10.

Further, the first transparent electrode is a plate-shaped common electrode 9', and the second transparent electrode is a slit-shaped pixel electrode 11'.

The data line 7 of the array substrate of the present embodiment is below the active layer 3, compared with the case that the data line is provided above the active layer, the distance between the data line 7 and the pixel electrode is increased, thereby the coupling capacitance between the data line and the pixel electrode is reduced, and the poor displays due to the large coupling capacitance are improved.

The present embodiment also provides a display apparatus comprising the above array substrate.

The display apparatus of the present embodiment may be a liquid crystal display panel, electronic paper, organic light emitting diode (OLED) display panel, liquid crystal display television, liquid crystal display device, digital photo frame, mobile phone, tablet computer, or any other products or members with display function.

As the display apparatus of the present embodiment comprises the above array substrate, the display quality thereof is improved.

It should be understood that, the above implementations are only used to explain the principle of the present invention, but not to limit the present invention. The person skilled in the art can make various variations and modifications without departing from the spirit and scope of the present invention, therefore, the variations and the modifications are also considered to be within the protection scope of the present invention.

The invention claimed is:

1. A manufacturing method of an array substrate, comprising the following steps:
S1, forming a data line metal layer on a substrate, and forming a pattern of a data line by a patterning process of the data line metal layer;
S2, forming a semiconductor layer on the substrate formed with the data line thereon, and forming a pattern of an active layer by a patterning process of the semiconductor layer, wherein the data line is connected with the active layer, and wherein the step S2 further comprises:

depositing a polycrystalline silicon layer on the substrate formed with the data line thereon by a molecular beam deposition method or a low pressure chemical vapor deposition method, or first depositing an amorphous silicon layer by a low pressure chemical vapor deposition method or a plasma enhanced chemical vapor deposition method, then forming a polycrystalline silicon layer by utilizing excimer laser annealing;

forming the pattern of the active layer by patterning the polycrystalline silicon layer;

forming an active region, a source region and a drain region by doping the active layer, wherein the source region and the drain region are located on two sides of the active region respectively, and the data line is connected with the source region; and, after step S2, S3, forming a gate insulator and a conducting metal layer on the substrate formed with the active layer thereon, and forming a pattern of a gate line by a patterning process of the conducting metal layer, wherein an overlapped region between projections of the gate line and the active layer on the substrate corresponds to the active region, and a part of the gate line corresponding to the overlapped region functions as a gate electrode;

wherein, in step S1, both of the pattern of the data line and a pattern of a shield metal for shielding the active region are formed by a same layer through the patterning process of the data line metal layer, and the shield metal is not electrically connected with any electrical components formed on the array substrate.

2. The manufacturing method of claim 1, wherein, before the step S2, further comprises: forming a buffer layer on the substrate formed with the data line thereon, and forming a via hole, for connecting the data line and the source region to be formed in the active layer, in the buffer layer by a patterning process of the buffer layer.

3. The manufacturing method of claim 1, wherein, after the step S3, further comprises:

S4, forming an inter-layer dielectric and a planarization layer on the substrate formed with the gate line thereon, and forming a via hole passing through the gate insulator, the inter-layer dielectric and the planarization layer by a patterning process of the gate insulator, the inter-layer dielectric and the planarization layer, wherein the via hole will be used for connecting the drain region and a first transparent electrode to be formed;

S5, forming a first transparent conducting layer on the substrate formed with the inter-layer dielectric and the planarization layer thereon, and forming a pattern of the first transparent electrode by a patterning process of the first transparent conducting layer;

S6, forming a passivation layer and a second transparent conducting layer on the substrate formed with the first transparent electrode thereon, and forming a pattern of a second transparent electrode by a patterning process of the second transparent conducting layer.

4. The manufacturing method of claim 1, wherein, after the step S3, further comprises:

S4, forming an inter-layer dielectric, a planarization layer and a first transparent conducting layer on the substrate formed with the gate line thereon, and forming a pattern of a first transparent electrode by a patterning process of the first transparent conducting layer;

S5, forming a passivation layer on the substrate formed with the first transparent electrode thereon, and forming a via hole passing through the gate insulator, the inter-layer dielectric, the planarization layer and the passivation layer by a patterning process of the gate insulator, the inter-layer dielectric, the planarization layer and the passivation layer, wherein the via hole will be used for connecting the drain region and a second transparent electrode to be formed;

S6, forming a second transparent conducting layer on the substrate formed with the passivation layer thereon, and forming a pattern of the second transparent electrode by a patterning process of the second transparent conducting layer.

5. The manufacturing method of claim 3, wherein, the first transparent electrode is a plate-shaped electrode, and the second transparent electrode is a slit-shaped electrode.

6. An array substrate, comprising a data line and an active layer, wherein the data line is below the active layer, and the data line is connected with the active layer, wherein the active layer is a low temperature poly-silicon layer, and the low temperature poly-silicon layer comprises an active region, a source region and a drain region, wherein the source region and the drain region are located on two sides of the active region respectively, and the data line is connected with the source region; and wherein the array substrate further comprises a gate insulator and a gate line above the active layer, and an overlapped region of projections of the gate line and the active layer on a substrate corresponds to the active region, and a part of the gate line corresponding to the overlapped region functions as a gate electrode; and wherein a pattern of a shield metal for shielding the active region of the active layer is formed by a same layer as the data line, and the shield metal is below the active layer, and the shield metal is not electrically connected with any electrical components formed on the array substrate.

7. The array substrate of claim 6, further comprising a buffer layer between the data line and the active layer, and a via hole for connecting the data line and the active layer is formed in the buffer layer.

8. The array substrate of claim 6, further comprising an inter-layer dielectric, a planarization layer, a first transparent electrode, a passivation layer and a second transparent electrode, wherein the drain region is connected with the first transparent electrode through a via hole passing through the gate insulator, the inter-layer dielectric and the planarization layer.

9. The array substrate of claim 6, further comprising an inter-layer dielectric, a planarization layer, a first transparent electrode, a passivation layer and a second transparent electrode above the gate line, and the drain region is connected with the second transparent electrode through a via hole passing through the gate insulator, the inter-layer dielectric, the planarization layer and the passivation layer.

10. The array substrate of claim 8, wherein, the first transparent electrode is a plate-shaped electrode, and the second transparent electrode is a slit-shaped electrode.

11. A display apparatus, comprising the array substrate of claim 6.

12. The manufacturing method of claim 4, wherein, the first transparent electrode is a plate-shaped electrode, and the second transparent electrode is a slit-shaped electrode.

13. The array substrate of claim 9, wherein, the first transparent electrode is a plate-shaped electrode, and the second transparent electrode is a slit-shaped electrode.

* * * * *